United States Patent [19]

Dubin et al.

[11] Patent Number: 4,897,327
[45] Date of Patent: Jan. 30, 1990

[54] CORRECT-READING IMAGES FROM PHOTOPOLYMER ELECTROGRAPHIC MASTER

[75] Inventors: Alan S. Dubin, Greenville; Catharine E. Looney, Wilmington; Steven P. Schmidt, Greenville, all of Del.

[73] Assignee: E. I. Du Pont de Nemours and Company, Wilmington, Del.

[21] Appl. No.: 199,445

[22] Filed: May 27, 1988

[51] Int. Cl.$^4$ ............................................ G03G 5/026
[52] U.S. Cl. ..................................... 430/45; 430/126; 430/97
[58] Field of Search ..................... 430/97, 49, 50, 126, 430/286, 45

[56] References Cited

U.S. PATENT DOCUMENTS

| | | | |
|---|---|---|---|
| 3,286,025 | 11/1966 | Ingersoll | 178/6.6 |
| 3,594,161 | 7/1971 | Kaufman | 96/1 |
| 3,836,364 | 9/1974 | Lin | 430/126 |
| 4,057,016 | 11/1977 | Endo et al. | 430/49 |
| 4,732,831 | 3/1988 | Riesenfeld et al. | 430/49 |

FOREIGN PATENT DOCUMENTS 0243934 11/1987 European Pat. Off. .
1194253 6/1970 United Kingdom .

Primary Examiner—John L. Goodrow

[57] ABSTRACT

Process for preparation of a correct reading image comprising
(A) exposing imagewise to actinic radiation a photopolymerizable electrographic element comprising in order a temporary support, photopolymerizable layer, and a strippable cover sheet, the exposure being through the cover sheet;
(B) stripping the cover sheet;
(C) laminating the exposed surface of the photopolymerizable layer to a conductive substrate;
(D) peeling off the temporary support;
(E) charging electrostatically the exposed photopolymerizable layer to form a latent image of electrostatic charge on the exposed areas;
(F) toning the electrostatically charged exposed imaged areas; and
(G) transferring the toned image to a receptor support.

Multiple copies can be produced with a single exposure.
Overlay or surprint proofs can be prepared.

32 Claims, 1 Drawing Sheet

CORRECT-READING IMAGES FROM PHOTOPOLYMER ELECTROGRAPHIC MASTER

DESCRIPTION

TECHNICAL FIELD

This invention relates to a process for the preparation of correct reading images. More particularly this invention relates to a process for the preparation of correct reading images using a photopolymer electrographic element.

BACKGROUND OF THE INVENTION

It is known that photopolymerizable elements can be used in electrographic applications. Ingersoll U.S. Pat. No. 3,286,025, for example, relates to electrographic imaging. A photopolymerizable layer comprising a polymeric binder, an ethylenically unsaturated monomer, and a photoinitiator is imagewise exposed, the exposure creating polymerized areas of reduced conductivity. When the polymerized areas are corona charged ona conductive support and toned, a toner image is formed. Ingersoll states that multiple copies can be made and describes a procedure whereby the nonimage areas of the photopolymerized element are washed out with a solvent, the developed element is placed on an offset press and printing is accomplished by lithographic technique. Ingersoll, however, does not disclose transferring a toned image to another support.

Figures 1, 2:
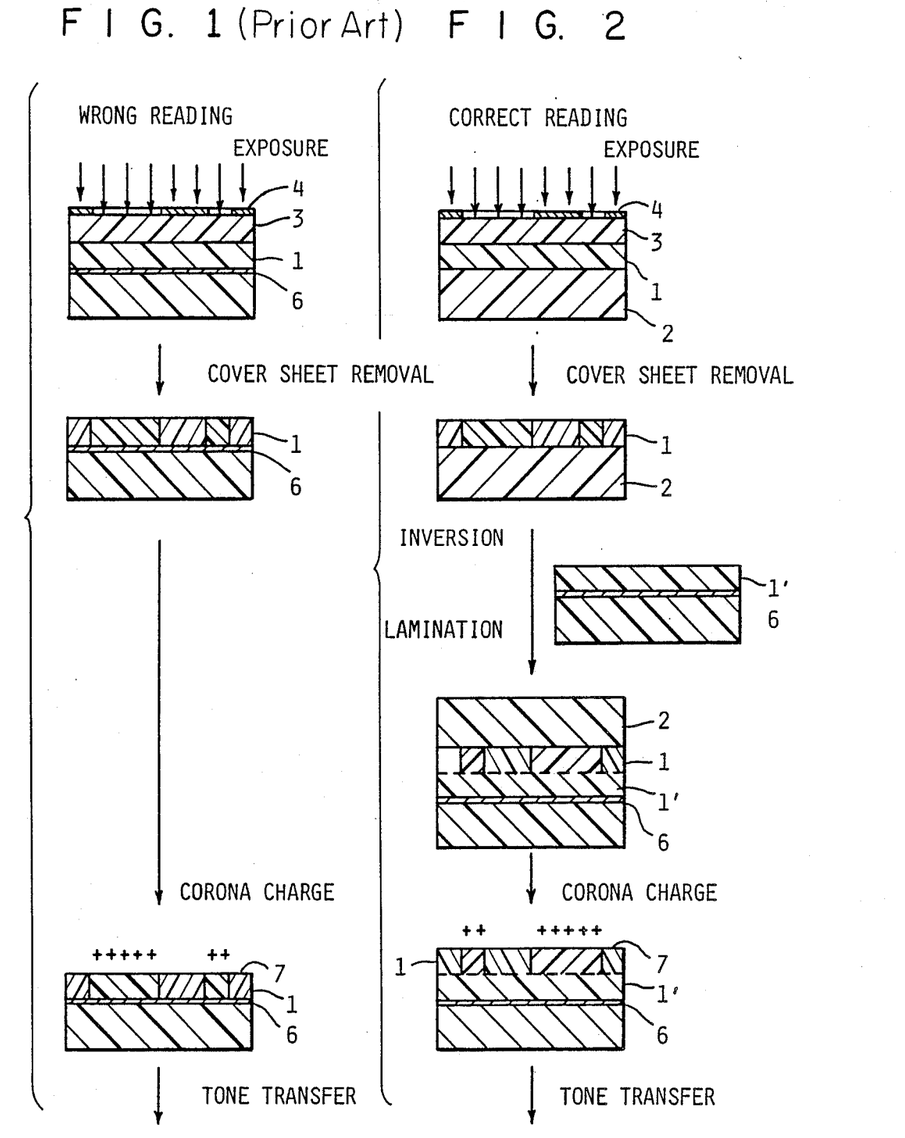
FIG. 1 is a cross-sectional view of a photopolymer electrographic element and the various stages of the preparation of a wrong reading transferred image according to the prior art.
FIG. 2 is a cross-sectional view of a photopolymer electrographic element and the various stages of the preparation of a correct reading transferred image according to the invention.

In assignee's Riesenfeld Dessauer, Bindless, Blanchet, and Dubin U.S. patent application Ser. No. 56,303, filed Jun. 1, 1987 now U.S. Pat. No. 4,732,831 there is described an image transfer process using a photopolymerizable electrographic element wherein the photopolymerizable layer is imagewise exposed, the exposed areas are electrostatically charged while present on a conductive support and then toned by applying an oppositely charged electrostatic toner, and the toned image is transferred to another surface. Riesenfeld et al. process the photopolymer layer is imagewise exposed, charged and toned on the same side. As shown in FIG. 1 below, such a process results in a wrong reading image being obtained on transfer to a receptor support unless the image bearing film or phototool is so configured to provide a wrong reading latent image on the surface of the photopolymerized layer which upon transfer is inverted to form a correct reading image. The preparation of an image bearing film useful with prior photopolymer elements is time consuming, inconvenient and increases the cost due to the need to make an additional image bearing film. It is desired that high quality, high resolution correct reading images be obtained directly from toned electrographic photopolymerizable elements using conventional image bearing films such as target negatives. It is particularly desired that such correct reading images be obtained by using liquid electrostatic developers.

SUMMARY OF THE INVENTION

In accordance with this invention there is provided a process for the preparation of a high resolution, correct reading image comprising
  (A) exposing a photopolymerizable electrographic element comprising in order, a temporary support, a photopolymerizable layer, and a strippable cover sheet, imagewise to actinic radiation through the cover sheet;
  (B) stripping the cover sheet from the exposed photopolymerizable layer;
  (C) laminating the surface of the exposed photopolymerizable layer to a conductive substrate;
  (D) peeling off the temporary support from the exposed photopolymerizable layer;
  (E) charging electrostatically the exposed photopolymerizable layer to form a latent image of electrostatic charge on the exposed areas;
  (F) toning the electrostatically charged exposed image areas; and
  (G) transferring the toned image to a receptor support.

In accordance with another embodiment of this invention there is provided a process for the preparation of a high resolution, correct reading image comprising
  (A) exposing a photopolymerizable electrographic element comprising in order, a temporary support, a photopolymerizable layer, and a strippable cover sheet, imagewise to actinic radiation from either the cover sheet or temporary support side of the element;
  (B) stripping the cover sheet or peeling off the temporary support prior to or subsequent to exposure from the exposed surface of the photopolymerizable layer;
  (C) laminating the surface of te exposed photopolymerizable layer to a conductive substrate;
  (D) peeling off either the temporary support or stripping the cover sheet from the exposed photopolymerizable layer;
  (E) charging electrostatically the exposed photopolymerizable layer;
  (F) toning the electrostatically charged exposed image areas; and
  (G) transferring the toned image to a receptor support.

BRIEF DESCRIPTION OF THE DRAWINGS

In the accompanying drawings forming a material part of this disclosure.

DETAILED DESCRIPTION OF THE INVENTION

The photohardenable (photopolymerizable) layer of the electrostatic element consists essentially of an organic polymeric binder, a compound having at least one ethylenically unsaturated group which can be a monomer, a photoinitiator, and optionally a chain transfer agent and/or either of (1) at least one organic electron donor, also known as a p-type conducting compound or at least one organic electron acceptor, also known as an n-type conducting compound as described in Blanchet-Fincher et al. U.S. Ser. No. 116,655, filed Nov. 4, 1987, or (2) a substituted aromatic amino compound, and preferably a strong acid as described in Blanchet-Fincher et al. U.S. Ser. No. 117,189, filed Nov. 4, 1987. Preferably a chain transfer agent is also present. "Consisting essentially of" as used in this specification and claims means that there can be present in the photohardenable layer, in addition to the primary ingredients, other ingredients which do not prevent the advantages of the invention from being achieved. These other ingredients which can also be present are set out below. Polymeric binders, ethylenically unsaturated compounds, photoinitiators, including preferred hexaarylbiimidazole compounds (HABI's) and chain transfer agents are disclosed in Chambers U.S. Pat. No. 3,479,185, Baum et al. U.S. Pat. No. 3,652,275, Cescon U.S. Pat. No. 3,784,557, Dueber U.S. Pat. No. 4,162,162, and Dessauer U.S. Pat. No. 4,252,887, the disclosures of each of which, as well as the two U.S. patent applications set out above, are incorporated herein by reference.

Binders

Suitable organic polymeric binders include: the polymerized methylmethacrylate resins including copolymers thereof, polyvinyl acetals such as polyvinyl butyral and polyvinyl formal, vinylidene chloride copolymers (e.g., vinylidene chloride/acrylonitrile, vinylidene chloride/methacrylate and vinylidene chloride/vinylacetate copolymers), synthetic rubbers (e.g., butadiene/acrylonitrile copolymers and chloro-2-butadiene-1,3-polymers), cellulose esters (e.g., cellulose acetate, cellulose acetate succinate and cellulose acetate butyrate), polyvinyl esters (e.g., polyvinyl acetate/acrylate, polyvinyl acetate/methacrylate and polyvinyl acetate), polyvinyl chloride and copolymers (e.g., polyvinyl chloride/acetate), polyurethanes, polystyrene, etc. Preferred binders are poly(styrene/methylmethacrylate) and polymethylmethacrylate. A preferred resistivity range of the exposed photohardened image areas is about $10^{14}$ to $10^{16}$ $\Omega$-cm, corresponding to a resistivity for the binder of $10^{16}$ to $10^{20}$ $\Omega$-cm range.

Ethylenically Unsaturated Compounds

Any ethylenically unsaturated photopolymerizable or photocrosslinkable compound identified in the prior patents for use in HABI-initiated systems can be used. The term "monomer" as used herein includes simple monomers as well as polymers, usually of number average molecular weight below 1500, having crosslinkable ethylenic groups. Number average molecular weights can be determined by known osmometry techniques. Preferred monomers are di-, tri- and tetra-acrylates and methacrylates such as ethylene glycol diacrylate, diethylene glycol diacrylate, triethylene glycol diacrylate, glycerol diacrylate, glycerol triacrylate, ethylene glycol dimethacrylate, 1,2-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate pentaerythritol triacrylate; the bisacrylates and bismethacrylates of polyethylene glycols of molecular weight 100–500, etc. A particularly preferred monomer is ethoxylated trimethylolpropane triacrylate.

Impurities in the ethylenically unsaturated compound can be the major source of charge carriers. Therefore, the overall discharge rate of the photohardenable layer is determined largely by these ionizable impurities. In generatl, the resistivities of the ethylenically unsaturated compounds range from $10^5$ to $10^9$ $\Omega$-cm with the resultant compositions having a resistivity of $10^{11}$ to $10^{13}$ $\Omega$-cm in the unexposed areas of the photohardenable layer.

Initiators

Preferred initiators are the HABI photoinitiators, 2,2'4,4'5,5'-hexaarylbiimidazoles, sometimes called 2,4,5-triarylimidazolyl dimers, which dissociate on exposure to actinic radiation to form the corresponding triarylimidazolyl free radicals. As indicated above, HABI's and use of HABI-initiated photopolymerizable systems for applications other than for electrostatic uses are disclosed in a number of patents. These include: Cescon U.S. Pat. No. 3,784,557; Chambers U.S. Pat. No. 3,479,185; Chang et al. U.S. Pat. No. 3,549,367; Baum et al. U.S. Pat. No. 3,652,275; Dueber U.S. Pat. No. 4,162,169; Dessauer U.S. Pat. No. 4,252,887; Chambers et al. U.S. Pat. No. 4,264,708; and Tanaka et al U.S. Pat. No. 4,459,349; the disclosures of these patents are incorporated herein by reference. Any 2-o-substituted HABI disclosed in the prior patents can be used in this invention. the HABI's can be represented by the general formula where the R's represent aryl radicals. The 2-o-substituted HABI's are those in which the aryl radicals at positions 2 and 2' are ortho-substituted. The other positions on the aryl radicals can be unsubstituted or carry any substituent which does not interfere with the dissociation of the HABI upon exposure or adversely affect the electrical or other characteristics of the photopolymer system.

Preferred HABI's are 2-o-chlorosubstituted hexaphenylbiimidazoles in which the other positions on the phenyl radicals are unsubstituted or substituted with chloro, methyl or methoxy. The most preferred HABI's are 2,2',4,4'-tetrakis(o-chlorophenyl)-5,5'-bis(m,p-dimethoxyphenyl)-biimidazole (TCTM-HABI) and 2,2'-bis(o-chlorophenyl)-4,4',5,5'-tetraphenylbiimidazole.

Processes for producing HABI compounds result in a mixture of isomers and other impurities. Use of high concentrations of these impure materials can provide photopolymerizable compositions with high sensitivity but poor shelflife or storage stability due to crystallization. It has been found that purification of the materials by various methods can provide relatively pure materials which can be used in high concentration without crystallization.

The HABI's can be purified sufficiently by dissolving then im methylene chloride, filtering and recrystallizing by adding methanol or ether. If desired, the solution of the HABI in methylene chloride* can be eluted through a silica gel column prior to recrystallization. Preferred methods for purificatioin of the preferred HABI's are as follows:

TCTM-HABI (1) Preferred method.

50 g of reddish brown TCTM-HABI (melting range 170°–215° C.) is added to 425 ml ethanol and 100 ml of distilled water. The slurry is stirred for 5 to 10 minutes and allowed to settle for 30 minutes. Most of the supernatant red liquid is removed. 200 ml of distilled water is added and the fresh slurry is stirred 5 to 10 minutes and filtered through #54 (fast) paper. The collected solid is dried at 120° C. for 3 to 5 hours. The yield of white solid is 44 g (88%) and with melting range (m.r.) 170° to 220° C.

(2) Alternate method 50 g of reddish brown TCTM-HABI is added to 250 ml ethanol and 200 ml of water. After stirring the slurry for 10 minutes, it is allowed to settle for 10 minutes prior to filtration through #5 (slow) paper. The solid is collected and after drying yields a white powder with similar yield and m.r. as above.

o-Cl-HABI 225 g of o-Cl-HABI (m.r. 205°-7° C.) is added to 1800 ml methylene chloride and solution heated to the boil. 150 g DARCO® G-60 charcoal activated, EM Science, a division of EM Industries, Inc., Cherry Hill, NJ is then added. The mixture is kept boiling for 30 to 45 minutes prior to hot filtration through Celite® Diatomaceous Silica Product, Manville Products Corp., Denver, CO under vacuum. The filtrate is concentrated to yield ca. 135 g (60%) solid with m.r. 203°-205° C. The filter pad is washed with 200 ml of methylene chloride and the filtrate concentrated to yield ca. 45 g (20%) solid with m.r. 203°-207° C.

Additional photoinitiators that are also useful in the photohardenable composition include polynuclear quinones, aromatic ketones and benzoin ethers. Useful polynuclear quinones are: α-ethyl anthraquinone, 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benanthraquinone, 2-methyl-1,4-naphthoquinone, 2,3-dichloronaphthoquinone, 1,4-dimethylanthraquinone, 2,3-dimethylanthraquinone, 2-phenyl-anthraquinone, 2,3-diphenylanthraquinone, sodium salt of anthraquinone α-sulfonic acid, 3-chloro-2-methylanthraquinone, retenequinone, 7,8,9,10-tetrahydronaphthacenequinone, 1,2,3,4-tetrahydrobenz(a)anthracene-7,12-dione; aromatic ketones, e.g., benzophenone, Michler's ketone (4,4'-bis(dimethylamino)benzophenone), 4,4'-bis(diethylamino)benzophenone, 4-acryloxy-4'-dimethylaminobenzophenone, 4-acryloxy-4'-diethylaminobenzophenone, 4-methoxy-4'-dimethylaminobenzophenone, phenanthrenequinone, 2,7-di-t-butylphenanthrenequinone, etc; benzoin ethers, e.g., benzoin methyl ether, benzoin ethyl ether and benzoin phenyl ether, methyl-benzoin benzoin, ethylbenzoin, etc.

Present in the photopolymerizable composition as a preferred component is at least one organic electron donor (also known as a p-type conducting compound), or at least one organic electron acceptor (also known as an n-type conducting compound), the disclosure of which is incorporated herein from Blanchet-Fincher et al. U.S. Ser. No. 116,655, filed Nov. 4, 1987 page 6, line 1 to page 7, line 20; or a substituted aromatic amino compound, and preferably a strong acid, the disclosure of which is incorporated herein from Blanchet-Fincher et al. U.S. Ser. No. 117,189, filed Nov. 4, 1987. Useful electron donors and electron acceptors present in an amount of at least 0.1% by weight based on the photopolymerizable composition have an oxidation potential of less than +2.5 eV or a reduction potential larger than −3.0 eV, respectively. The substituted armoatic amino compound is present in an amount of at least 3% by weight (based on the total weight of the photopolymerizable composition).

In combination with a substituted aromatic amino compound, in nonoxidized form, there is present in the photopolymerizable layer a strong acid which is present in an amount of 0.33 mole to 1.0 mole per mole of amino nitrogen of the amino compound, and the combination of these compounds being present in an amount of at least 3% by weight, with the proviso that the substituted aromatic amino compound is present in an amount of at least 1.6% by weight, the weight percentages being based on the total weight of the photopolymerizable layer. The combination of substituted aromatic amino compound and acid are present in a total amount of 3 to 15% by weight, preferably 3 to 5% by weight based on the total weight of the photohardenable layer. The ratio of compound to acid is one acid molecule per amino group molecule on a molar basis.

Chain Transfer Agent

Any chain transfer agent (CTA) identified in the prior patents for use with HABI-initiated photopolymerizable systems can be used. For example, Baum et al. U.S. Pat. No. 3,652,275 lists N-phenylglycine, 1,1-dimethyl-3,5-diketocyclohexane, and organic thiols such as 2-mercaptobenzothiazole, 2-mercaptobenzoxazole, 2-mercaptobenzimidazole, pentaerythritol tetrakis (mercaptoacetate), 4-acetamidothiophenol, mercaptosuccinic acid, dodecanethiol, and beta-mercaptoethanol. Others which can be used include various tertiary amines known in the art, 2-mercaptoethane sulfonic acid, 1-phenyl-4H-tetrazole-5-thiol, 6-mercaptopurine monohydrate, bis-(5-mercapto-1,3,4-thiodiazole-2-yl, 2-mercapto-5-nitrobenzimidazole, and 2-mercapto-4-sulfo-6-chlorobenzoxazole. The preferred CTA's are 2-mercaptobenzoxazole (2-MBO) and 2-mercaptobenzothiazole (2-MBT). Expecially preferred are 2-MBO and 2-MBT purified as illustrated below for 2-MBO:

2-MBO: Optimum Melting Point 193°-194° C.

(1) For slightly impure lots (m.r.: 191°-193° C.) the following procedure is employed:

A slurry of 300 g 2-MBO in 1500 ml methanol is stirred for 5 to 10 minutes and allowed to settle. Generally, the solvent layer assumes a red appearance due to impurities. The undissolved solid is filtered through #5 filter paper in a Buchner funnel with house vacuum. Solid is washed with cold methanol (1 100 ml portion), collected and dried in an oven at 70°-80° C. for 3 to 5 hours, subsequently pulverized and dried for an additional hour. Yield is approximately 150 g (50%) of white powder, m.r. 193°-94° C.

(2) For impure lots (m.p. below 191° C.) the following procedure is used:

250 g brown 2-MBO, 50 g DARCO® G-60, charcoal activated, as described above, 1500 ml methylene chloride and 600 ml methanol are stirred in a 4 liter Erlenmeyer flask with gentle boiling for 30 to 40 minutes. The mixture is filtered hot through fast (#4) paper under low vacuum. The red liquor that is collected is concentrated under low vacuum until 2-MBO precipitates out of solution. 200 ml of fresh methanol is added, and the resulting slurry is agitated to break up large lumps. The slurry is filtered through slow (#5) paper and washed with 50 ml fresh methanol. The colorless precipitate is collected and dried at 70 to 80 degrees for 3 to 5 hours as above. Yield of product, melting above 192° C. is ca. 50%.

Additives

In addition to the primary ingredients of polymeric binder, ethylenically unsaturated compound, initiator, and preferred chain transfer agent, the photohardenable compositions can contain conventional ingredients such as co-initiators, thermal stabilizers, plasticizers, optical brighteners, energy transfer dyes (i.e., visible light sensitizers), UV absorbers, photoinhibitors, etc. The preferred thermal stabilizer is 1,4,4-trimethyl-2,3-diazobicyclo-(3.2.2)-non-2-ene-N,N-dioxide (TAOBN). Leuco dyes can also be present, e.g., Leuco Malachite Green, Leuco Crystal Violet, and leuco dyes disclosed in Baum et al. U.S. Pat. No. 3,652,275, col. 7, line 40 to col. 11, line 31, the disclosure of which is incorporated herein by reference. Visible light sensitizers and photoinhibitors are disclosed in Dueber U.S. Pat. No. 4,162,162 and Pazos U.S. Pat. No. 4,198,242, respectively, the disclosures of which are incorporated herein by reference.

In general, the essential components should be used in the following approximate proportions: binder 40–75 percent, preferably 50–65 percent; monomer 15–40 percent; preferably 20–32 percent; initiator 1–20 percent, preferably 1–16 percent; and preferably a chain transfer agent 0–5 percent, preferably 0.1–4 percent. These are weight percentages based on total weight of the photopolymerizable composition. The preferred proportions depend upon the particular compounds selected for each component. For example, a high conductivity monomer can be used in smaller amount than a low conductivity monomer, since the former will be more efficient in eliminating charge from unexposed areas.

The amount of photoinitiator such as HABI and chain transfer agent, e.g., 2-MBO, etc. incorporated in the photohardenable layer will depend upon film speed requirement. Higher speed compositions can be used with laser imaging in recording digitized information, as in digital color proofing. For analog applications, e.g., exposure through a negative, film speed requirement depends upon mode of exposure. If the exposure device is a flat-bed type, where the negative is placed over the photopolymer matrix, exposures of up to 60 seconds can be used and a photographically slow film will be acceptable. For a drum exposure device, with a collimated source of radiation, the exposure per pixel may be brief and a higher speed photopolymer layer may be more useful.

The photohardenable layer is prepared by mixing the ingredients of the photopolymerizable system in a solvent such as methylene chloride usually in a weight ratio of about 15:85 to 25:75, coating a substrate, and evaporating the solvent. Coating thickness should be uniform and about 3 to 15 μm, preferably 7 to 12 μm dry. Dry coating weight should be about 30 to 150 mg/dm$^2$, preferably 70 to 130 mg/dm$^2$.

The support of the photopolymerizable element is preferably a temporary support and as such can be any surface to which the photopolymer layer can be coated or laminated thereto and easily removed therefrom by peeling or stipping. Suitable supports include polymeric films such as polyethylene terephthalate and other polyesters, polyethylene, polypropylene, etc. which may have suitable release layers present thereon, e.g., silicone release layer, gel subbing layer, etc. The temporary support also may be a conductive support of any type such as a conductive polymeric film, paper, synthetic resin, etc., which has been coated on one or both sides with a metal, conductive oxide, or metal halide by vapor deposition or sputtering chemical deposition. Preferably the nonconductive support is used since it is cheaper.

The cover sheet for the photopolymerizable element must be easily removed from the photopolymerized layer, e.g., by stripping or other type of removal operation. Examples of suitable cover sheets include polyethylene, polypropylene, polyester, etc. Polypropylene is preferred.

The photopolymerizable element is exposed by actinic radiation which is an energy source whereby the exposed areas become hardened or polymerized. Suitable radiation depends on the sensitivity of the particularly photopolymerizable layer composition used to form the photopolymerizable layer. Generally standard ultraviolet energy sources are used. If, however, the photopolymerizable is sensitive to visible light then that type of exposure source can be used. Exposure sources can also be of the laser type. The exposing radiation can be modulated either by digital or analog means. Analog exposure utilizes a line or half-tone negative or other pattern interposed between the radiation source and photopolymerizable layer. It is preferred that when the image is present as a negative photographic film the emulsion side be placed adjacent to the photopolymerizable layer. Digital exposure is by means of a computer controlled visible light-emitting laser which can scan the film in raster fashion. For digital exposure a high speed photopolymerizable element is utilized, e.g., one containing a high-level of hexaarylbiimidazole photoinitiator, chain transfer agent and sensitized to higher wavelength light with a sensitizing dye.

Prior to or after the imagewise exposure either the cover sheet or the temporary support can be removed by stripping or peeling. In a preferred process the cover sheet is stripped after the imagewise exposure. The exposed photopolymer surface from which the cover sheet or temporary support has been removed is then laminated at elevated temperature to a conductive substrate, e.g., a type as described above and which includes an aluminzed polyester film, copper board conductive substrate, indium-tin oxide coated film, etc. Lamination is accomplished by procefures known to those skilled in the art. The temperature must not be greater than the temperature that degrades the photopolymerziable layer. After the lamination, either the temporary support is peeled or the cover sheet is stripped from teh exposed photopolymerizable layer. Stripping and peeling operations are known to those skilled in the art.

The preferred charging means for the photopolymerizable layer is corona discharge. Other charging methods, e.g., discharge of a capacitor, can also be used.

After the imagewise exposed photopolymerizable layer is electrostatically charged, the surfac open to the air is toned by means of an electrostatic dry toner or liquid developer, the latter being preferred. Dry electrostatic toners are known to those skilled in the art. Any electrostatic liquid developer and any method of developer applicatioin can be used. Preferred liquid electrostatic developers are suspensions of pigmented resin toner particles in nonpolar liquids which are generally charged with ionic or zwitterionic compounds. The nonpolar liquids normally used are the Isopar ® branched-chain aliphatic hydrocarbons (sold by Exxon Corporation) which have a Kauri-butanol value of less than 30 and optionally containing various adjuvants as described in Mitchell U.S. Pat. Nos. 4,631,244 and 4,663,264, Taggi U.S. Pat. No. 4,670,370, Larson and Trout U.S. Pat. No. 4,681,831, El-Sayed and Taggi U.S. Pat. No. 4,702,984, Larson U.S. Pat. No. 4,702,985, Trout U.S. Pat. No. 4,707,429 and assignee's U.S. patent application Ser. No. 854,610 filed Apr. 22, 1986 now U.S. Pat. No. 4,734,352. These are narrow high-purity cuts of isoparaffinic hydrocarbon fractions with the following boiling ranges: Isopar®-G, 157°–176° C.; Isopar®-H 176°–191° C.; Isopar®-K 177°–197° C.; Isopar®-L 188°–206° C.; Isopar®-M 207°–254° C.; Isopar®-V 254°–329° C. Preferred resins are copolymers of ethylene (80 to 99.9%)/acrylic or methacrylic acid (20 to 0%)/alkyl of acrylic or methacrylic acid where alkyl is 1 to 5 carbon atoms (0 to 20%), e.g., copolymers of ethylene (89%) and methacrylic acid (11%) having a melt index at 190° C. of 100. The resin toner particles preferably have an average particle size (by area) of less than 10 $\mu$m as measured by a Horbia CAPA-500 centrigugal particle analyzer, Horiba Instruments, Inc., Irvine, CA. Preferred nonpolar liquid soluble ionic or zwitterionic components are lecithin and Basic Barium Petronate® oil-soluble petroleum sulfonate manufactured by Sonneborn Divisioin of Witco Chemical Corp., New York, NY. Many of the monomers useful in teh photohardenable composition are soluble in these Isopar® hydrocarbons, especially in Isopar®-L. Consequently, repeated toning with Isopar® based toners to make multiple copies can deteriorate the electrical properties of the master by extraction of monomer from unexposed areas. The preferred monomers are relatively insoluble in Isopar® hydrocarbons, and extended contact with these liquids does not unduly deteriorate films made with these monomers. Photopolymerizable electrostatic elements made with other, more soluble monomers can still be used to make multiple copies, using liquid toner having a dispersant with less solvent action.

After toning with dry toner or developing with liquid electrostatic developer (toner) the toned image is transferred to another surface or receptive support, such as paper, for the preparation of a proof. Other substrates include but are not limited to polymeric films, cloth or other printable materials and surfaces. For making integrated circuit boards, the transfer surface can be an insulating board on which conductive circuit lines can be printed by this process, or it can be an insulating board covered with a conductor (e.g., a fiber glass board covered with a copper layer) on which a resist is printed by this process. Transfer is accomplished by electrostatic or other means, e.g., by contact with an adhesive receptor surface or applying pressure and heat. Electrostatic transfer can be accomplished in any known manner, e.g., by palcing the receptive support on a conductive cylinder and brining the toned surface within 0.002 to 0.1 inch (0.05 to 2.54 mm) of the paper, the gap being filled with Isopar® hydrocarbon. A positive potential is applied to the conductive cylinder, driving the toner particles of the developer off the photohardenable electrostatic master onto the receptive support, e.g., paper. Alternatively the paper may be placed in contact with the developed image using a tackdown roll or corona which when held at negative voltages will press the two surfaces together assuring intimate contact. After tackdown a positive corona discharge is applied to the backside of the paper driving the toner particles of the developer off the photohardenable electrostatic master onto the paper. Proofs can be prepared from the single imagewise exposure of up to four separate photopolymerizable layers by repeating the charging electrostatically, toning and transferring steps either in register over the previously transferred image to form a surpring proof (yellow, cyan, magenta and black) or on a separate receptor support to form an overlay proof when the above four color images are placed in register over one another. The proofs are preferably prepared by exposing the photopolyermizable layer through a right-reading half-tone process-color separation negative film having its emulsion side in contact witht he cover sheet of the photopolymerizable element. After remoeval of the cover sheet, lamination, removal of temporary support, the element is charged and toned or developed with the corresponding process-color toner. In making multiple images from a single imagewise exposed photopolyermizable element it is only necessary to repeat the steps of charging electrostatically, toning and transferring. Each transfer requires a separate receptor support or surface.

INDUSTRIAL APPLICABILITY

This invention is useful in the preparation of high quality, high resolution correct reading images transferred directly to receptor supports such as paper, plastic films, etc., from toned photopolymerizable electrographic elements. Multiple copies of the correct reading image can be made with a single exposure (polymerization produced thereby is permanent) by repeating only the charging, toning, and transferring steps. Among the many uses visualized for the process are: short printing runs, preparation of color proofs, e.g., overlay, surprint, reproducing engineering drawings, and printing integrated circuit boards.

EXAMPLES

The following examples wherein the parts and percentages are by weight illustrate but do not limit the invention. In Example 1 the numbers set out for several components of the element correspond to the numbers used in FIGS. 1 and 2.

EXAMPLE 1

A layer of a photopolymerizable composition (1) containing of 57.0% poly(styrenemethylmethacrylate), 28.6% ethoxylated trimethylolpropane triacrylate, 10.6% 2,2',4,4'-tetrakis(o-chlorophenyl)-5,5'-bis(m,p-dimethoxyphenyl)-biimidazole, and 3.8% 2-mercaptobenzoxazole was coated on a temporary polyethylene terephthalate film substrate (2). A 0.00075 inch (0.0019 cm) thick polypropylene cover sheet (3) was laminated to the dried photopolymerizable layer which was imagewise exposed in a Douthitt Option X unit manufactured by Douthitt Corp., Detroit, MI, equipped with a Model TU64 Violux 5002 lamp assembly manufactured by Exposure Systems Corporation, Bridgeport, CT and a photopolymer type 5027 lamp, through a half-tone negative film (4) with its emulsion side in contact with the polypropylene cover sheet (3) of the photopolymerizable layer. The phalf-tone negative film used was right-reading when viewed with its emulsion side down. The polypropylene cover sheet (3) was removed, and the face of the photopolymerizable layer that had been in contact with the cover sheet was laminated with a heated (105° C.) two-roll device at 1 inch/second (2.54 cm/seconds) to a conductive substrate which was prepared from a coating of the above-described photopolymerizable composition (1') (unexposed) on aluminized polyethylene terephthalate (6). The temporary polyethylene terephthalate film substrate (2), now acting as a cover sheet, was peeled off, revealing the face (7) of the photopolymerizable layer opposite to that which was originally exposed.

The exposed laminate was charged positively by passing over a +4.5 kV corotron at ~0.5 inch/second (~1.77 cm/second). This afforded +270 V on exposed regions of the film, and less than +15 volts in unexposed regions, measured 15 seconds after charging. The film was then toned with a negatively charged liquid electrostatic toner, using a 0.04 inch (~1.0 mm) toner-filled gap between a flat development electrode and the charged film.

The liquid toner was prepared with the following ingredients: 200 grams of copolymer of ethylene (89%) and methacrylic acid (11%) having a melt index at 190° C. of 100, and an acid no. of 66; 25.6 grams of Steling NS carbon black, Cabot Corp., Boston, MA; 1.6 grams of Heucophthal Blue BT 583D, Heubach, Inc., Newark NJ; and 1000 grams of Isopar®-L, hydrocarbon, Exxon Corp. All the ingredients were placed in a Union Process 1-S Attritor, Union Process Company, Akron, Ohio, along with 0.1875 inch (4.76 mm) diameter stainless steel balls. The contents were heated to 100° C. +/− 10° C. and milled at 220 RPM for 2 hours. The Attritor was then cooled to 25° C. +/− 5° C., while the milling continued and 700 grams of Isopar®-H were added. Milling was continued at 330 RPM for 16 hours, affording a dispersion of tonere particles with average particle size (by area) of 1.5 μm determined by using a Horiba CAPA-500 centrifugal particle size analyzer. The toner concentrate was separated from the stainless steel media and diluted to 2 percent solids by the addition of Isopar®-H. Two kg of toner were charged by the addition of 12 grams of a 10% solution of lecithin (Fisher Scientific) in Isopar®-H. The charged toner was diluted to 0.5%, solids by the addition of Isopar®-H.

The toned image was laterally reversed from the image of the half-tone negative film used for exposure. A half-tone dot range of 2–95% (150 line/inch screen) was achieved.

The toned image was electrostatically transferred to paper using a bias roll. Plainwell Solitaire offset enamel paper was wrapped around a metal drum to whic a voltage of +200 V was applied. The toned photopolymerizable film was spaced 0.006 inch (0.15 mm) from the paper, the gap being filled with Isopar®-H. Transfer was carried out at 0.17 ips (0.43 cm/second). Lateral reversal of the image occurs in transfer: the image transferred to paper is of the same handedness as that of the half-tone negative film used for exposure, i.e., correct-reading. The paper was removed from the bias roll and was heated at 110° C. for 1 minute to fuse the toned image and fix it to the paper. Transferred dot range was 2–93% (150 line/inch screen) for a 16 unit exposure.

For comparison, a layer of the above-described photopolymerizable composition (1) was coated on aluminized polyethylene terephthalate (6). A polypropylene cover sheet (3) was laminated to the dried photopolymerizable layer. The film was exposed with the above-described exposure device using a half tone negative film with its emulsion side in contact with the cover sheet. The cover sheet was removed, and this exposed face (7) of the photopolymerizable film was charged and toned as described above, and the image transferred to paper also as described above. The toned image was of the same handedness as that of the half-tone negative film used for exposure, and the transferred image was laterally reversed. Transferred dot range was 2–95% for an 8 unit exposure, and thus is comparable to that achieved with the intermediate inversion and lamination steps above. The dot gain for transferred 50% half-tone dots was 17–20% for both processes.

CONTROL 1

A layer of the photopolymerizable composition described in Example 1 was coated on a transparent coductive substrate, consisting of indium-tin oxide on 0.007 inch (0.18 mm) polyethylene terephthalate. A polypropylene cover sheet was laminated to the dried photopolymer film. The film was exposed with the exposure device described in Example 1, but with the emulsion side of the half-tone negative film in contact with the polyethylene terephthalate base. No lamination step was needed. Removal of the polypropylene cover sheet revealed the face of the photopolymer film opposite to that which was exposed. Charging and toning was carried out as described in Example 1. The toned image was thus laterally reversed from the image of the half-tone negative film used for the exposure. In comparison to Example 1, the toned image of this control was of poorer dot range and resolution. This result was caused by shadowing during exposure through the interposed polyethylene terephthalate base. The results are shown in Table 1 below.

TABLE 1

| Exposure | Toned Dot Range (150 line/inch screen) |
| --- | --- |
| 16 | 4–70% |
| 8 | 4–80% |
| 4 | 9–85% |

CONTROL 2

A layer of the photopolymerizable composition described in Example 1 was coated on aluminized polyethylene terephthalate. A polypropylene cover sheet was laminated to the dried photopolymer film. The element was exposed in the exposure device described in Example 1, but having the base side, rather than the emulsion side, of the half-tone negative film in contact with the cover sheet. The cover sheet was removed and the film was charged and toned and the toned image was transferred to paper as described in Example 1. The transferred image was of the same handedness as the half-tone negative film, when viewed with its emulsion side down. Toned dot range was only 2–85%, compared to 2–97% for the same film exposed for the same time but witht he emulsion side of the negative in contact with the cover sheet. Dot gain for 50% half-tones was 30% for the present example, compared with just 15% for the emulsion-cover sheet contact exposure. The low resolution and high dot gain in the present control resulted from shadowing during exposure through the half-tone negative base.

EXAMPLE 2

The photopolymerizable composition described in Example 1 was coated on a temporary polyethylene terephthalate base having a silicone release coating. A polypropylene cover sheet was laminated to the dried photopolymerizable layer. The temporary base was peeled off and the photopolymerizable layer was imagewise exposed through a half-tone negative film with its emulsion side in contact with the composition. The surface of the exposed photopolymer layer was laminated to the conductive substrate described in Example 1 and the polypropylene cover sheet was then removed, revealing the face of the photopolymer layer opposite to that which was exposed.

The exposed and laminated film was charged and toned as described in Example 1. The toned image, laterally reversed from the image of the half-tone negative film used for exposure, displayed the dot range indicated below in Table 2. Transfer by bias roll afforded an image on paper of the same handedness as that of the half-tone negative film. Transferred dot range was 3-97% for a 2 unit exposure.

TABLE 2

| Exposure (units) | Toned Dot Range (150 line/inch screen) |
| --- | --- |
| 2 | 3-99% |
| 4 | 2-98% |
| 16 | 2-98% |
| 32 | 1-97% |

EXAMPLE 3

A photopolymerizable composition containing 62.5% poly(styrene-methylmethacrylate), 30% ethoxylated trimethylolpropane triacrylate, 2.5% 2,2'4,4'-tetra kis(o-chlorophenyl)-5,5'-bis(m,p-dimethoxyphenyl)biimidazole, and 6% 2-mercaptobenzoxazole was coated on aluminized polyethylene terephthalate. A polypropylene cover sheet was laminated to the dried photopolymerizable layer. The aluminized polyethylene terephthalate was removed, leaving the photopolymerizable film laminated to the polypropylene cover sheet. The film was exposed for 8 units to the exposure device described in Example 1 through a half-tone negative film with its emulsion side in direct contact with the photopolymerizable layer.

The exposed face was laminated with 220° F. (105° C.) rollers to a copper board coated with 0.5% benzotriazole in ethoxylated trimethylolpropane triacrylate, which served as the conductive substrate. The polypropylene cover sheet was then removed, revealing the face of the photopolymer film opposite to that which had been exposed, the exposed face being laminated to the copper substrate.

The exposed laminate was charged and toned as described in Example 1. Half-tone shadow dots of 97% (150 line/inch screen) were achieved.

EXAMPLE 4

A layer of the photopolymerizable composition described in Example 1 was coated on resin-coated 0.004 inch (0.10 mm) Cronar ® polyester photographic film temporary support which had been overcoated with a gel subbing. A polypropylene cover sheet was laminated to the dried photopolymerizable layer. The composition was exposed for 2.5 seconds in a nuArc platemaker, Model FT40LC manufactured by nuArc Corporation, Chicago, IL, equipped with a 4 kw pulsed Xenon arc source, through a half-tone negative film with its emulsion side in contact with the polypropylene cover sheet. The cover sheet was removed and the exposed face of the composition was laminated to a conductive substrate using a two-roll device at 225° F. (125° C.) operating at 1 inch (2.54 cm)/minute. The conductive substrate consisted of a coating of Carboset ®525, B. F. Goodrich, Cleveland, OH, which is a terpolymer of methylmelthacrylate, ethyl acrylate, and methacrylic acid on aluminized polyethylene terephthalate. The temporary support described above was removed, revealing the face of the photopolymerizable layer opposite to that which was exposed.

The exposed and laminated film was charged and toned as described in Example 1, using a charging corotron potential of +4.35 kV, and applying a +70 V bias potential to the development electrode. For a 3-uint exposure the toned image had a range of 5-95% half-tone dots (150 line/inch screen), and the toned image was of the opposite handedness as that of the original half-tone negative film. Transfer of the toned image to paper by the bias roll technique described in Example 1 afforded an image on paper of the same handedness as that of the original half-tone film.

EXAMPLE 5

A layer of a photopolymerizable composition containing 57.0% polymethylmethacrylate, 28.2% ethoxylated trimethylolpropane triacrylate, 10.6% 2,2',4,4'-tetrakis(o-chlorophenyl)-5,5'-bis(m,p-dimethoxyphenyl)-biimidazole, and 3.8% 2-mercaptobenzoxazole was coated on a 0.006 inch (0.015 cm) gel-subbed polyethylene terephthalate film support. A 0.00075 inch (0.002 cm) polypropylene cover sheet was laminated to the dried photopolymerizable layer. The photopolymerizable element was iamgewise exposed in the device described in Example 1 through a half-tone negative film with its emulsion side in contact with the polypropylene cover sheet. The half-tone negative film used was right-reading when viewed with its emulsion side down. The polypropylene cover sheet was removed, and the revealed exposed face of the photopolymerizable film was laminated with a heated (235° F. or —113° C.) two-roll device at 1 inch/second (2.54 cm/second) to a conductive substrate which was prepared from a coating of 66.6% polymethylmethacrylate and 33.4% ethoxylated trimethylolpropane triacrylate on aluminized polyethylene terephthalate.

The orginal polyethylene terephthalate support was peeled off, revealing the face of the photopolymerizable layer opposite to that which was originally exposed.

The exposed laminate was charged and toned as described in Example 1. With a 4 unit exposure 3-98% half-tone dots (150 line/inch screen) were toned; with a 16 unit exposure 2-95% toned dots were achieved. The toned image was transferred to paper by the bias roll technique and fused as decribed in Example 1. This afforded an image on paper of the same handedness as that of the original half-tone negative film (right-reading), with 3-95% half-tone dots resolved for a 4 unit exposure.

EXAMPLE 6

The photopolymerizable element described in Example 5 was exposed for 16 units through a half-tone negative film in the contact exposure device described in Example 1. The polypropylene cover sheet was removed and the exposed face was laminated to a conductive base as described in Example 5. The original polyethylene terephthalate support was peeled off, revealing the face of the photopolymer layer opposite to that which was originally exposed.

The exposed laminate was charged by passing over a +5.5 kV corotron at 1 inch (2.54 cm)/second. Dry electrostatic toner (Kodak Ektaprint 85 Copier Monocomponent A toner, Eastman Kodak Co., Rochester, NY) was applied by gently blowing it across the surface of the film. The toned image on the photopolymerziable element had a range of 4-95% half-tone dots (150 line-/inch screen), and was of the opposite handedness as that of the original half-tone film. The dry toned electrostatic image can be transferred to a paper by electrostatic or other means.

We claim:

1. Process for the preparation of a high resolution, correct reading image comprising
    (A) exposing a photopolymerizable electrographic element comprising in order, a temporary support, a photopolymerizable layer, and a strippable cover sheet, imagewise to actinic radiation through the cover sheet;
    (B) stripping the cover sheet from the exposed photopolymerizable layer;
    (C) laminating the exposed surface of the photopolymerizable layer to a conductive substrate;
    (D) peeling off the temporary support from the exposed photopolymerizable layer;
    (E) charging electrostatically the surface of the exposed photopolymerizable layer opposite to that which was originally exposed layer to form a latent image of the electrostatic charge on the exposed areas;
    (F) toning the electrostatically charged exposed image areas; and
    (G) transferring the tones image to a receptor support.

2. A proces according to claim 1 wherein the receptor support is paper.

3. A process according to claim 1 wherein the receptor support is a polymeric film.

4. A process according to claim 1 wherein the conductive substrate is aluminized polyester.

5. A process according to claim 4 wherein the conductive substrate is a copper board.

6. A process according to claim 1 wherein the exposed photopolymerizable layer is charged electrostatically by corona discharge.

7. A process according to claim 1 wherein the electrostatically charged exposed image areas are toned by means of a liquid electrostatic toner.

8. A process according to claim 1 wherein the electrostatically charged exposed image areas are toned by means of a dry electrostatic toner.

9. a process according to claim 1 wherein steps (E), (F) and (G) are repeated to produce multiple copies with a single exposure.

10. A process according to claim 1 wherein The photopolymerizable layer of the the photopolymerizable element consists essentially of a polymeric binder, an ethylenically unsaturated monomeric compound, a photoinitiator, and a chain transfer agent.

11. A process according to claim 1 wherein the photoinitiator is a 2-o-substituted hexaarylbiimidazole compound.

12. A process according to claim 11 wherein the binder is poly(sytrene/methylmethacrylate).

13. A process according to claim 11 wherein the binder is polymethylmethacrylate.

14. A process according to claim 10 wherein the exposure is made through a right-reading halftone process-color separation negative film having its emulsion side in contact with the cover sheet of the photopolymerizable element, the charged element is toned with the corresponding process-color toner, the transferred toned image providing one layer of a 4-color overlay or surpring color proof.

15. A process according to claim 14 wherein a 4-color surprint on paper is prepared by repeating the steps 4 times using a different photopolymerizable element each time with a yellow, magenta, cyan and black right-reading process-color separation halftone negative film with the corresponding process-color toner.

16. Process for the preparation of a high resolution, correct reading image comprising
    (A) exposing a photopolymerizable electrographic element comprising in order, a temporary support, a photopolymerizable layer, and a strippable cover sheet, imagewise to actinic radiation from either the cover sheet or temporary support side of the element;
    (B) stripping the cover sheet or peeling off the temporary support prior to or subsequent to exposure from the exposed surface of the photopolymerizable layer;
    (C) laminating the exposed surface of the photopolymerizable layer to a conductive substrate;
    (D) peeling off either the temporary support or stripping the cover sheet from the exposed photopolymerizable layer;
    (E) charging electrostatically the surface of the exposed photopolymerizable layer opposite to that which was originally exposed;
    (F) tonign the electrostatically charged exposed image areas; and
    (G) transferring the toned iamge to a receptor support.

17. A process according to claim 16 wherein the temporary support of the photopolymerizable electrographic element is a conductive support which is removed prior to exposure.

18. A process according to claim 17 wherein the conductive support is aluminized polyester.

19. A process according to claim 16 wherein the exposed photopolymerizable layer is laminated to a copper board conductive substrate.

20. A process according to claim 16 wherein the receptor support is paper.

21. A process according to claim 16 wherein the exposed photopolymerizable layer is charged electrostatically by corona discharge.

22. A process according to claim 16 wherein the electrostatically charged exposed image areas are toned by means of a liquid electrostatic toner.

23. A process according to claim 16 wherein the electrostatically charged exposed image areas are toned by means of a dry electrostatic toner.

24. A process according to claim 16 wherein steps (E), (F) and (G) are repeated to produce multiple copies with a single exposure.

25. A process according to claim 16 wherein the photopolymerizable layer of the photopolymerizable element consists essentially of a polymeric binder, an ethylenically unsaturated monomeric compound a photoinitiator, and a chain transfer agent.

26. A process according to claim 16 wherein the photoinitiator is a 2-o-substituted hexaarylbiimidazole compound.

27. A process according to claim 26 wherein the binder is poly(styrene/methylamethacrylate).

28. A process according to claim 26 wherein the binder is polymelthylmethacrylate.

29. A process according to claim 25 wherein the exposure is made through a right-reading halftone process-color separation negative film having its emulsion side in contact with the cover sheet of the photopolymerizable element, the charged element is toned with the corresponding process-color toner, the transferred toned image providing one layer of a 4-color overlay or surprint color proof.

30. A process according to claim 29 wherein a 4-color surprint on paper is prepared by repeating the steps 4 times using a different photopolymerizable element each time with a yellow, magenta, cyan and black right-reading process-color separation halftone negative film with the corresponding process-color toner.

31. A process according to claim 1 wherein the conductive substrate to which the exposed photopolymerizable layer is laminated bears a photopolymerizable layer.

32. A process according to claim 16 wherein the conductive substrate to which the exposed photopolymerizable layer is laminated bears a photopolymerizable layer.

* * * * *